United States Patent [19]

Kim et al.

[11] Patent Number: 5,396,083
[45] Date of Patent: Mar. 7, 1995

[54] THIN FILM TRANSISTOR AND METHOD OF MAKING THE SAME

[75] Inventors: Jeong H. Kim, Seoul; Ui Y. Oh, Kyungki-do, both of Rep. of Korea

[73] Assignee: Goldstar Co., Ltd., Seoul, Rep. of Korea

[21] Appl. No.: 80,237

[22] Filed: Jun. 23, 1993

[30] Foreign Application Priority Data

Jun. 30, 1992 [KR] Rep. of Korea ............... 11602/1992
Jul. 7, 1992 [KR] Rep. of Korea ............... 12069/1992

[51] Int. Cl.⁶ .................. H01L 27/01; H01L 27/12; H01L 27/02
[52] U.S. Cl. .................. 257/59; 257/347; 257/351; 257/369; 257/401
[58] Field of Search ................. 257/59, 61, 66, 67, 257/74, 347, 350, 351, 369, 401, 532, 749, 773

[56] References Cited

U.S. PATENT DOCUMENTS 4,272,880 6/1981 Pashley .................. 257/351

Primary Examiner—Mark V. Prenty

[57] ABSTRACT

A thin film transistor and a method of making the same. The TFT comprises: an insulation substrate; a first TFT, the first TFT including a first source electrode and a first drain electrode formed on the insulation substrate, a first active layer formed so that it is contacted with the first source electrode and the first drain electrode and a common gate electrode formed through an insulation layer on the first source electrode, the first drain electrode and the first active layer; and a second TFT, the second TFT including the common gate electrode, a second active layer formed through an insulation layer on the common gate electrode, a second source electrode and a second drain electrode formed on the second active layer and be contacted with the first source electrode and the first drain electrode at a portion thereof.

13 Claims, 10 Drawing Sheets

THIN FILM TRANSISTOR AND METHOD OF MAKING THE SAME

BACKGROUND OF THE INVENTION

The present invention relates to a thin film transistor (TFT) and a method of making the same, and more particularly to a thin film transistor having a vertical-double structure and a method of making the same.

Figure 1:
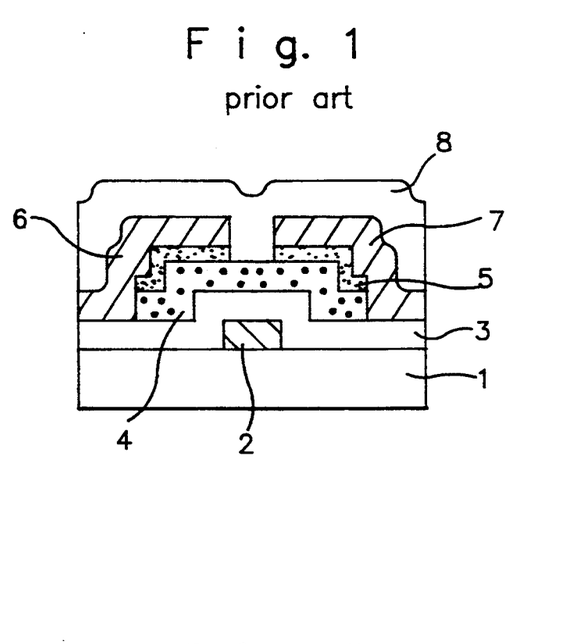
FIG. 1 is a sectional view illustrating a structure of a conventional TFT.

Referring to FIG. 1, there is illustrated the structure of a thin film transistor serving as a driving element, in a conventional liquid display device of active matrix type.

Hereinafter, a method of making the conventional TFT shown in FIG. 1 will be described.

On a glass substrate 1, first, a metal such as Cr, Al or Ta is deposited to form a first metal layer and then the metal is patterned to form a gate having a pattern.

Subsequently, an insulation material such as oxide or nitride is deposited on the whole surface of the glass substrate 1 which includes the gate 2 using a plasma enhanced chemical vapour deposition, as first insulation layer 3.

Thereafter, over the first insulation layer 3 are formed a semiconductor layer serving as an active layer 4 and a semiconductor layer 5 in which an impurity is doped, in this order.

The active layer 4 is then patterned so that it has a desired pattern. The semiconductor layer 5 is used as a layer for ohmic contact with source and drain electrodes which will thereafter be formed.

Subsequently, over the exposed whole surface, a second metal layer is deposited and then patterned so that it has desired patterns, thereby to form a source electrode 6 and a drain electrode 7.

A dry etching process is carried out on the semiconductor layer 5 so as to remove the semiconductor layer 5 doped with an impurity corresponding to a channel portion between the source electrode 6 and the drain electrode 7, and hence to form a TFT.

Subsequently, a protection layer 8 is formed on the exposed whole surface of the glass substrate 1 including the TFT, so as to protect the TFT formed as above mentioned.

In case of applying the conventional TFT formed as hereinbefore described to a driving circuit of a liquid display device of active matrix type, a plurality of TFTs constructs a TFT array, so as to individually drive each pixels of the liquid display device of active matrix type.

On the other hand, the number of total TFTs is increased in the TFT array as the liquid display device of active matrix type becomes more on a large scale and in a high-integration.

Therefore, the size of TFT becomes smaller, and hence characteristic thereof is also deteriorated.

Namely, since channel width is also reduced in accordance with the reduction of size thereof, turn-on current thereof is reduced in proportion to the size.

Therefore, it is impossible to obtain image of high quality through the liquid display device.

The increase of number of total TFTs in the TFT array also causes the production rate of TFT to reduced, upon manufacturing TFTs and also causes the opening rate of each pixels of the liquid display device to be reduced, in accordance with the high integration thereof.

SUMMARY OF THE INVENTION

Therefore, the present invention has been made in view of the above problem, and it is an object of the present invention to provide a TFT having a vertical-double structure, to form improve the characteristic of TFT.

It is another object of the present invention to provide a method of making a TFT capable of improving the characteristic of TFT.

In accordance with a first aspect of the present invention, there is provided a TFT comprising:

an insulation substrate;

the first TFT including a source electrode and a first drain electrode formed on the insulation substrate, a first active layer formed so that it is contacted with the first source electrode and the first drain electrode and a common gate electrode formed through an insulation layer on the first source electrode, the first drain electrode and the first active layer; and a common gate electrode, a second active layer formed through an insulation layer on the common gate electrode, a second source electrode and a drain electrode formed on the second active layer and be contacted with the first source electrode and the first drain electrode at a portion thereof.

In accordance with a second aspect of the present invention, there is provided a method of making a TFT, comprising the steps of:

forming a first conductive layer and a first semiconductor layer on an insulation substrate in this order and patterning the first conductive layer and the first semiconductor layer, thereby forming a first source electrode, a first drain electrode, a first source wire and a first ohmic contact layer;

forming a second semiconductor layer on the exposed whole surface and patterning the second semiconductor layer, thereby forming a first active layer;

forming a first insulation layer and a second conductive layer on the exposed whole surface, in this order and patterning the second conductive layer, thereby forming a common gate electrode;

forming a second insulation layer, a third semiconductor layer and a fourth semiconductor layer on the exposed whole surface, in this order and patterning the fourth semiconductor layer and the third semiconductor layer, in this order, thereby forming a second active layer;

forming a third conductive layer on the exposed whole surface and patterning the third conductive layer, to form a second source electrode, a second drain electrode and a second source wire; and etching the fourth semiconductor layer using the second source electrode and the second drain electrode as an etch mask, to form a second ohmic contact layer.

In accordance with a third aspect of the present invention, there is provided a method of making a TFT, comprising the steps of:

forming a first conductive layer and a first semiconductor layer on an insulation substrate, in this order and patterning the first conductive layer and the first semiconductor layer, to form a first source electrode, a first drain electrode and a first ohmic contact layer;

forming a second semiconductor layer, a first insulation layer and a second conductive layer on the exposed whole surface, in this order and then patterning the second conductive layer, to form a common gate electrode;

forming a second insulation layer, a third semiconductor layer a fourth semiconductor layer on the exposed whole surface, in this order and patterning them, such that selected portions of the first source electrode and the first drain electrode are exposed;

forming a third conductive layer on the exposed whole surface and patterning that to form a second source electrode and a second drain electrode; and etching the fourth semiconductor layer using a second source electrode and a second drain electrode as an etch mask, to form a second ohmic contact layer.

DETAILED DESCRIPTIONS OF THE PREFERRED EMBODIMENTS

Hereinafter, the present invention will be described in detail in conjunction with the accompanying drawings.

Figure 2:
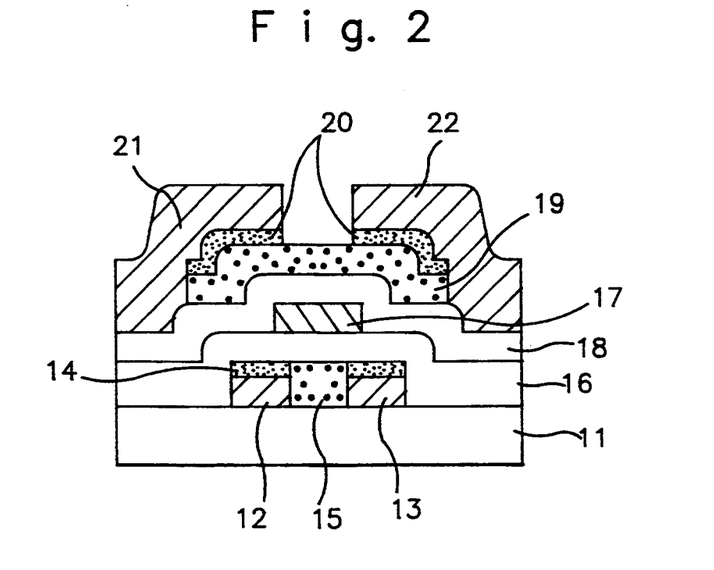
FIG. 2 is a sectional view illustrating a structure of a TFT in accordance with a first embodiment of the present invention.

Referring to FIG. 2, there is illustrated a sectional view showing a structure of a TFT in accordance with a fist embodiment of the present invention.

As shown in FIG. 2, the TFT of the present invention comprises a common gate electrode 17 which is located at the central portion thereof, a first source electrode 12 and a first drain electrode which are located at the lower side of the common gate electrode 17 in a vertical direction to a substrate and a second source electrode 21 and a second drain electrode 22 which are located at the upper side of the common gate electrode 17 in the vertical direction to the substrate.

Therefore, the TFT has a double structure.

An insulation layer 16 is formed on the lower surface of the common gate electrode 17 and an insulation layer 18 is formed on the upper surface of the common gate electrode 17, thereby forming ohmic contact layer 20,14 for ohmic contacts between the active layers 19,15 and the first source/drain electrodes 12,13 and the second source/drain electrode 21,22.

The first source/drain electrodes 12,13 are connected to a first source wire (not shown) and the second source/drain electrodes 21,22 are connected to a second source wire (not shown). The first source wire is connected to the second source wire at their selected portions through an opening (not shown) which is formed in the insulation layers 16,18, thereby enabling the first source/drain electrodes 12,13 and the second source/drain electrodes 21,22 to be contacted one another.

Therefore, a portion of the TFT comprising the common gate electrode 17 and the first source/drain electrodes 12,13 can be driven together with a second portion of the TFT comprising the gate electrode 17 and the second source/drain electrodes 21,22.

Referring to FIGS. 3a through 3g, there is illustrated a method of making the TFT having the double structure in accordance with the present invention.

Figure 3A:
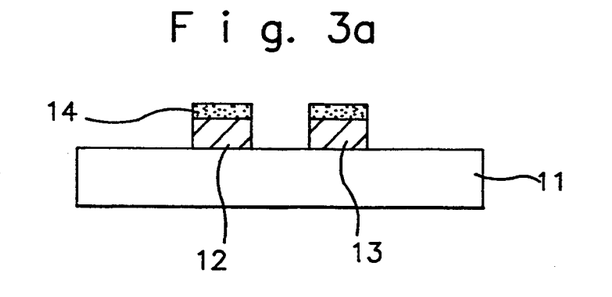
FIGS. 3a to 3g are sectional views illustrating a method of making a TFT in accordance with the first embodiment of the present invention.

As shown in FIG. 3a, first, over the surface of an insulation substrate 11, a first conductive layer 12 for forming source/drain electrodes and source wire is formed.

Over the surface of the first conductive layer 12 is formed an impurity-doped semiconductor layer 13 serving as a first semiconductor layer to form an ohmic contact layer.

The first conductive layer 12 and the semiconductor layer 13 are patterned with a photolithography process and an etch process, thereby forming a first source electrode 12, a first drain electrode 13, a first source wire (not shown) and a first ohmic contact layer 14.

Figure 3B:
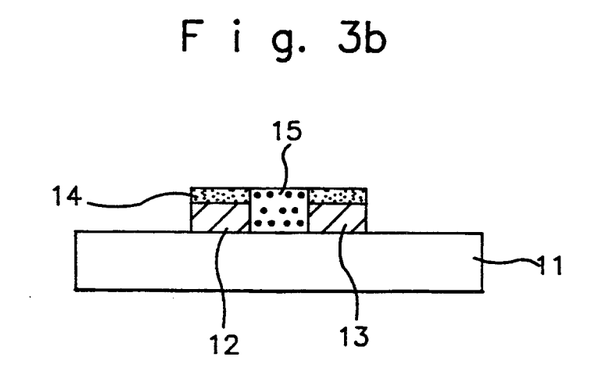

As shown in FIG. 3b, subsequently, a second semiconductor layer is formed on the exposed whole surface and then patterned with a predetermined pattern to form a first active layer 15.

Figure 3C:
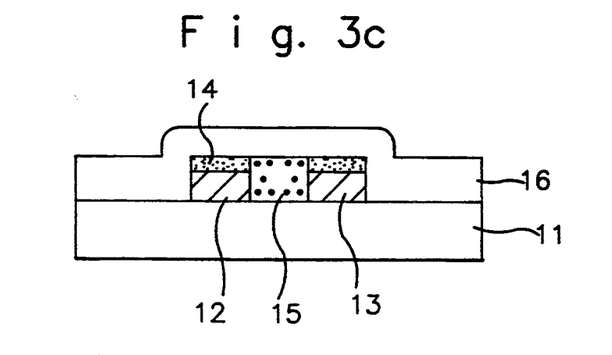

As shown in FIG. 3c, over the exposed whole surface is formed a first insulation layer 16 such as SiNx or SiO₂.

Figure 3D:
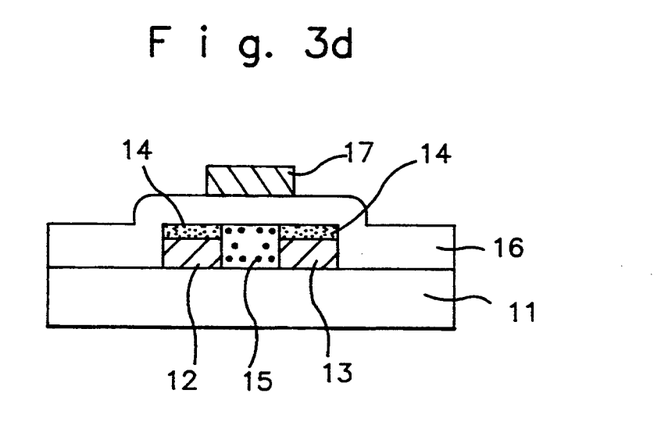

As shown in FIG. 3d, a second conductive layer for forming a gate electrode is formed on the first insulation 16 and then patterned with a predetermined pattern, thereby forming a common gate electrode 17.

Figure 3E:
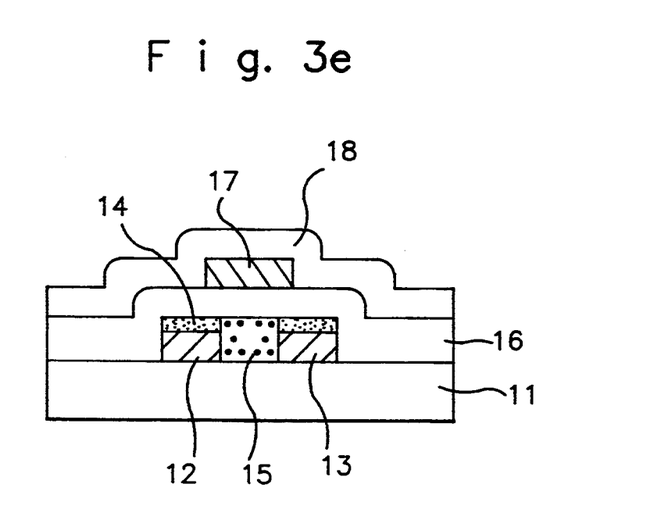

Subsequently, a second insulation layer 18 is formed on the wholes surface of the insulation substrate 11 including the surface of the common gate electrode 17 as shown in FIG. 3e.

Figure 3F:
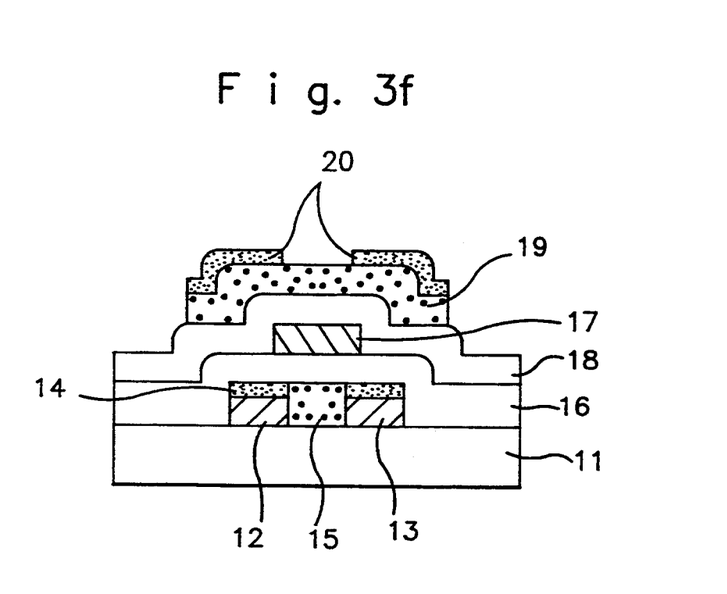

As shown in FIG. 3f, a third semiconductor layer and a fourth semiconductor layer doped with an impurity are deposited, in this order and then patterned with a predetermined pattern to form a second active layer 19.

Subsequently, an opening (not shown) is formed at a selected portion of the first insulation layer 16 and the second insulation layer 18 so that a selected portion of the source wire(not shown) is exposed.

Figure 3G:
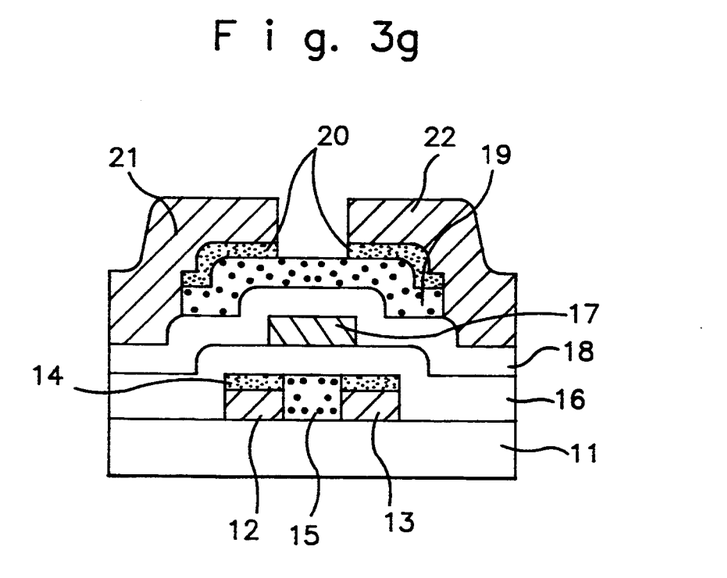

As shown in FIG. 3g, thereafter, a third conductive layer for forming second source/drain electrodes and a second source wire is formed and then patterned with a predetermined pattern, thereby forming a second source electrode 21, a second drain electrode 22 and a second source wire (not shown).

Subsequently, using the second source/drain electrodes as an etch mask, a dry etch process is carried out on the fourth semiconductor layer doped with an impurity corresponding to the channel portion of the second active layer 19, thereby forming a second ohmic contact layer 20.

At this time, the first source wire(not shown) is connected to the second source wire(not shown) via the opening (not shown) formed at the selected portion of the first insulation layer 16 and the second insulation layer 18, and hence the first source and drain electrodes 12,13 and the second source and drain electrodes 21,22 formed with a same conductive layer together with the first and second source/drain wires are contacted one another.

Therefore, a TFT having a double structure in accordance with the present invention is completely made.

The TFT comprises:
a fist TFT having the first source/drain electrodes 12,13 and the common gate electrode 17; and
a second TFT having the second source/drain electrodes 21,22 and the common gate electrode 17.

Figure 4:
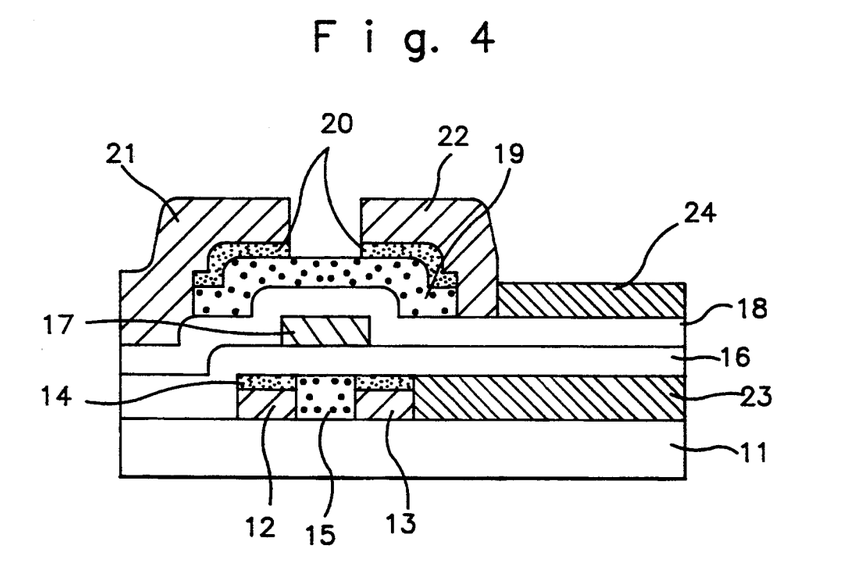
FIG. 4 is a sectional view illustrating a structure of a TFT in accordance with a second embodiment of the present invention.

Referring to FIG. 4 showing a second embodiment of the present invention, there is illustrated a diagram showing a case in which the TFT having a double structure is applied to a TFT having a double pixel electrode.

In FIG. 4, pixel electrodes 23,24 made of a transparent conductive film with a double structure of an upper part and a lower part are formed such that they are connected to the first drain electrode 12 and the second drain electrode 22, respectively.

The pixel electrodes 23,24 may be used as a storage capacitor with no loss in connection with opening rate. As another embodiment, the TFT shown in FIG. 2 may be varied.

That is, a NMOS may be formed as the lower transistor and a PMOS may be formed as the upper transistor, in case of forming TFTs respectively in the lower part and the upper part of a gate electrode, using the gate electrode in common.

Of course, it is possible to form PMOS as the lower transistor and NMOS as the upper transistor.

At this time, the NMOS transistor is formed by doping an element such as phosphorous(P) into an active layer and the PMOS transistor is formed be doping an element such as boron(B) into the active layer.

Figure 5:
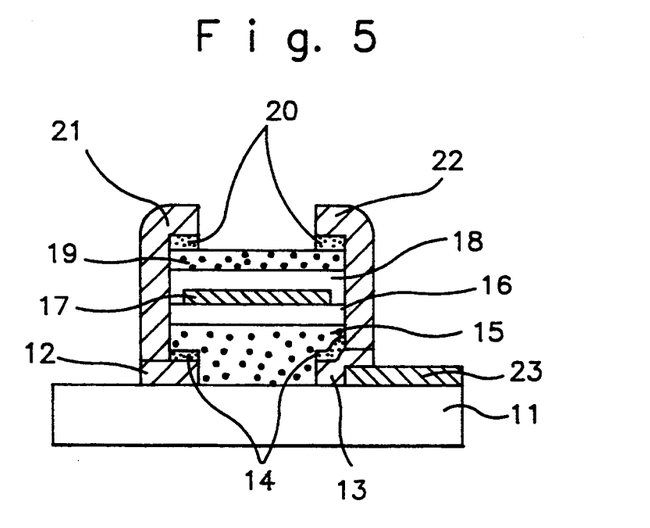
FIG. 5 is a sectional view illustrating a structure of a TFT in accordance with a third embodiment of the present invention.
Figure 6A:
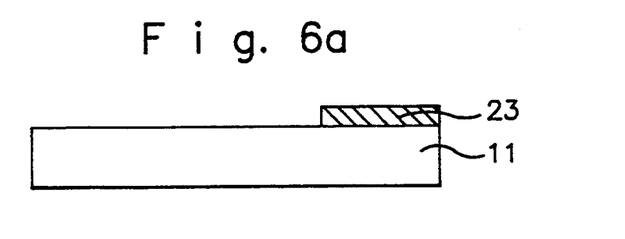
FIGS. 6a to 6g are sectional view illustrating a method of making a TFT in accordance with the third embodiment of the present invention.
Figure 6B:
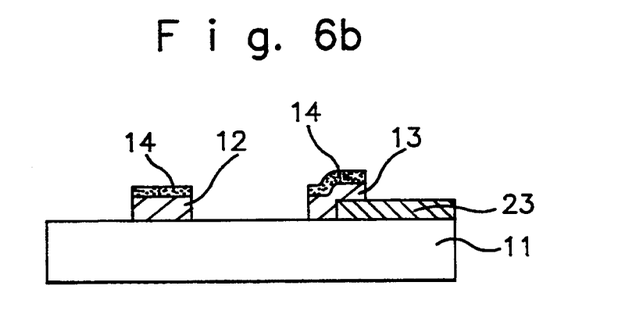
Figure 6C:
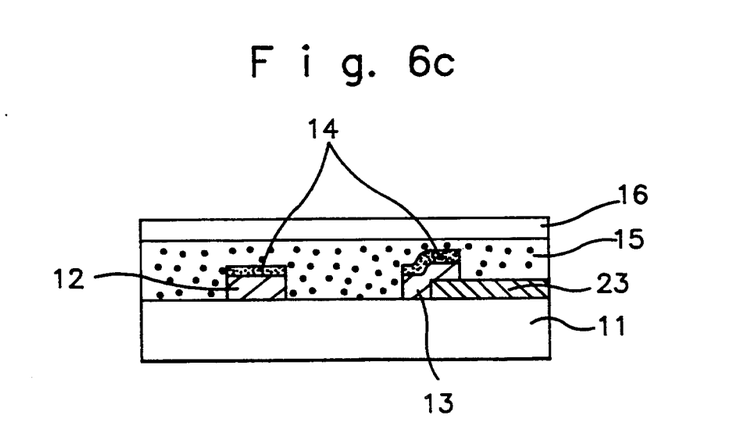
Figure 6D:
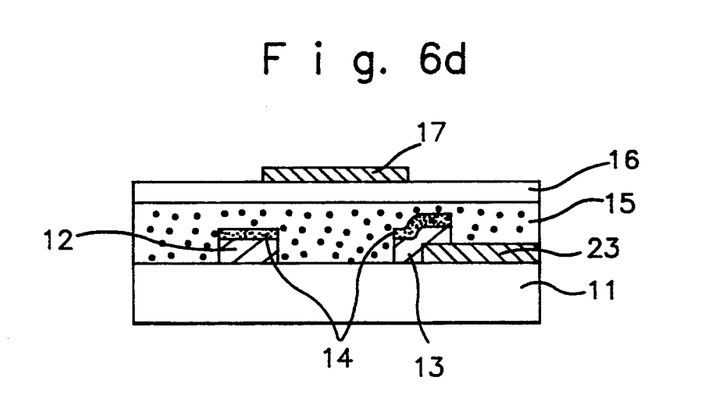
Figure 6E:
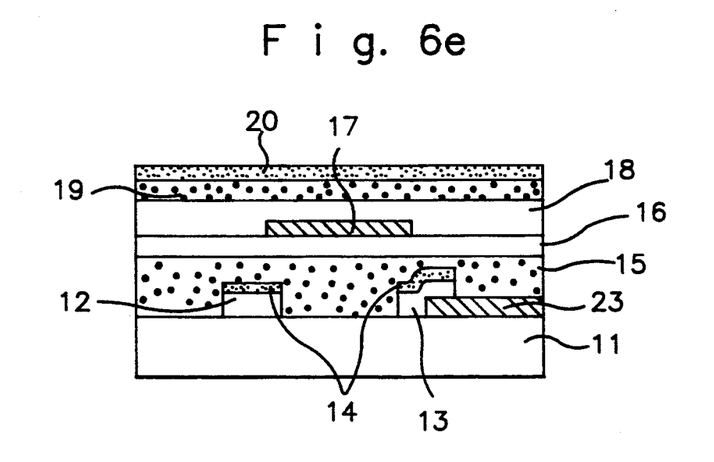
Figure 6F:
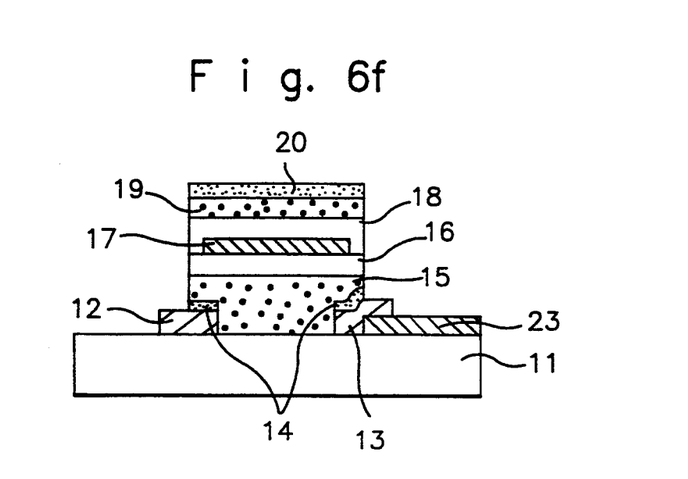
Figure 6G:
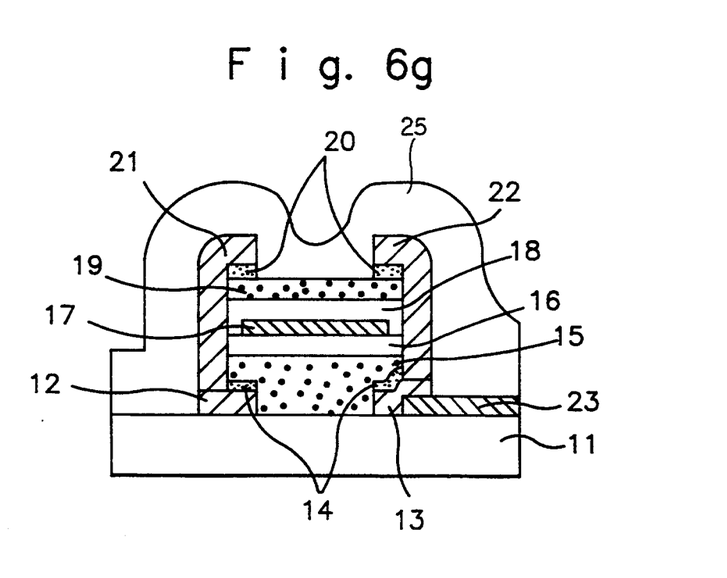
Figure 7:
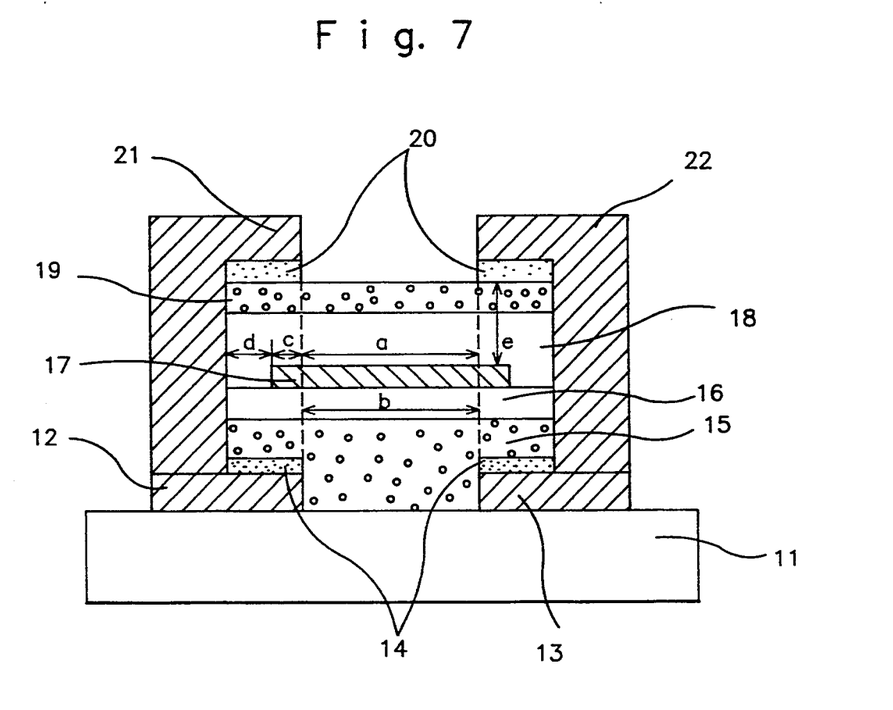
FIG. 7 is a sectional view illustrating a preferable structure of a TFT in accordance with the present invention.

Referring to FIGS. 5 through 7, there is illustrated a third embodiment of the present invention.

FIG. 5 shows a sectional view of a TFT in accordance with the third embodiment of the present invention.

According to the TFT, first source/drain electrodes 12, 13 are directly connected to second source/drain electrodes 21,22 and one side of the first source/drain electrodes 12,13 is contacted with a pixel electrode 23.

Hereinafter, a method of making the TFT shown in FIG. 5 will be described in detail, in conjunction with FIGS. 6a to 6g.

As shown in FIG. 6a, a transparent conductive film is deposited on an insulation substrate 11 with a thickness of 1000 Å–1500 Å using a sputtering apparatus and then patterned with a pattern using a photolithography and etch process, so as to form a pixel electrode 23.

As shown in FIG. 6b, subsequently, over the exposed whole surface of the insulation substrate 11 in which the pixel electrode 23 are formed a first conductive layer and a first semiconductor layer deped with an impurity, in this order and then patterned with a pattern to form a first source electrode 12 and a drain electrode 13.

At this time, the first conductive layer is made of selected one of metals such as Al, Cr, Mo, Ta, Ag, Cu and Ti or their alloys. The semiconductor layer doped with an impurity is made of an amorphous silicon doped with an element such as phosphorous or a micro-crystal silicon (Mc—Si).

The first source/drain electrodes 12,13 may be also made of a silicide. Namely, an amorphous semiconductor layer and a metal are deposited in this order and they are subjected to an annealing process, thereby converting the metal to the silicide.

The silicide is then patterned with a pattern to form the first source/drain electrode 12,13.

At this time, one side of the first source/drain electrodes 12,13 is contacted with the pixel electrode 23.

As shown in FIG. 6c, thereafter, a second semiconductor layer 15 for forming an active layer with a thickness 500–1500 Å and a first insulation layer 16 made of an insulation material such as SiNx or SiO$_2$ are formed on the exposed whole surface.

The first insulation layer 16 may be formed of an insulation film consisting of multi-layers.

As shown in FIG. 6d, subsequently, a second conductive layer is formed on the first insulation layer 16 and then patterned with a pattern to form a gate electrode 17.

The second conductive layer is made of selected one of metals such as Al, Cr, Mo, Ta, AG, Cu and Ti or their alloys.

At this time, the gate electrode 17 is formed by the patterning process, such that it is overlapped with the first source/drain electrodes 12,13 more than at least 0.5 μm.

As shown in FIG. 6e, a third semiconductor layer 19 is formed with a thickness of 500–1500 Å on the expose whole surface to form a second insulation layer 18 and an active layer. Thereafter, a fourth semiconductor layer 20 doped with an impurity is formed to form an ohmic contact layer.

The fourth semiconductor layer 20 can be formed by doping an element such as phosphorous ions into the amorphous silicon layer.

The fourth semiconductor layer 20 can be also made of a crystal silicon.

Herein, the second insulation layer 18 is formed using a process same or similar as that of forming the first insulation layer 16. Also, the third semiconductor layer 19 is formed using a process same or similar as that of forming the second semiconductor layer 15.

As shown in FIG. 6f, subsequently, the first semiconductor layer 14, the stack structure comprising the second semiconductor layer 15, the first insulation layer 16, the second insulation layer 18, the third semiconductor layer 19 and the fourth semiconductor layer 20 in this order are patterned with a given pattern by a photolithography and etch process, thereby exposing a selected portion of the first source/drain electrodes 12,13 and simultaneously forming a second active layer 19 consisting of the third semiconductor layer 19. At this time, the pattern of the stack structure has a lager width above 2 μm than that of the gate electrode 17 and is patterned, such that it is formed inside by a predetermined length from the edges of the first source/drain electrodes 12,13.

As shown in FIG. 6g, subsequently, a third conductive layer is deposited on the exposed whole surface and then patterned with a given pattern, to form a second source electrode 21 and a second drain electrode 22.

At this time, the third conductive layer is patterned to form the second source/drain electrode 21,22 using a mask same as or larger a little than that used upon forming the first source/drain electrodes 12,13.

Therefore, the first source/drain electrodes 12,13 are contacted with the second source/drain electrodes 21,22 through the selected portion of the first source/drain electrodes 12,13 which is exposed upon patterning the stack structure.

Subsequently, a dry etching process is carried out to remove the semiconductor layer 20 doped with an impurity corresponding to the channel portion of the second active layer 19, and hence to form a second ohmic contact layer 20.

Thereafter, a protection layer 25 is formed on the exposed whole surface, to protect transistor and pixel electrode. Referring to FIG. 6, there is illustrated a sectional view showing a preferable structure of a TFT in accordance with the present invention.

The channel ("a" portion) of the second TFT comprising of the common gate electrode 17 and the second source/drain electrodes 21,22 can be formed, such that it may have a length same as or different from that of the channel ("b" portion) of the first TFT comprising of the common gate electrode 17 and the first source/drain electrodes 12,13.

It is preferable that the common gate electrode 17 is overlapped with the first source/drain electrodes 12,13 and the second source/drain electrodes 21,22 by a portion ("c" portion) of above 0.5 μm at least.

It is also preferable that the horizontal length ("d" portion) between the common gate electrode 17 and the first source/drain electrodes 12,13 is longer above 2 μm than the vertical length ("e" portion).

As above mentioned, since the TFT of the present invention has the double structure comprising of an upper part of a lower part, its channel length becomes has twice length as compared with that of the conventional TFT and its turn-on current is also increased twice as compared with that of the conventional TFT. Since the conductor wires of the present invention have a double structure, the wire resistance is reduced, thereby enabling the signal delay to be prevented.

According to the present invention, as hereinbefore described, since the TFT has the double structure in a vertical direction, the channel width is increased.

Therefore the electrical characteristic can be improved due to the increased channel width.

Since the TFT has the double wiring structure, the wire resistance is reduced, thereby enabling the signal delay to be prevented.

Since the TFT of the present invention can increase the opening rate of pixel as compared with that of the conventional TFT, it is possible to obtain a liquid display device having a high screen quality.

Since the present invention also uses the double structure, it is possible to reduce the size of TFT, under a condition that the TFT has same characteristic as that of the conventional TFT.

In case of applying the present invention to a liquid display device having an active matrix type, it is possible to increase the product rate of TFT since the number of total TFTs can be reduced under a condition same as that of the conventional TFT. Therefore, it is possible to obtain a liquid display device of active matrix type which is more integrated and has a large scale as compared with a conventional liquid display device of active matrix type.

What is claimed is:

1. A thin film transistor comprising:
   an insulation substrate;
   a first source electrode and a first drain electrode formed on the insulation substrate, a first active layer formed so that it is in contact with the first source electrode and the first drain electrode;
   a common gate electrode formed on a first insulation layer which is on the first source electrode, the first drain electrode and the first active layer;
   a second active layer formed on a second insulation layer which is on the common gate electrode,
   a second source electrode and a second drain electrode formed on the second active layer
   first means for connecting the first source electrode to the second source electrode; and
   second means for connecting the first drain electrode to the second drain electrode.

2. A thin film transistor as set forth in claim 1, further comprising a first portion which is a n type portion having a N type active layer and a second portion which is a P type portion having a P type active layer.

3. A thin film transistor as set forth in claim 1, further comprising a first portion which is a P type portion having a P type active layer and a second portion which is a N type portion having a N type active layer.

4. A thin film transistor as set forth in claim 1, further comprising an ohmic contact layer between the first active layer and the first source electrode and the first drain electrode.

5. A thin film transistor as set forth in claim 1, further comprising an ohmic contact layer between the second active layer and the second source electrode and the second drain electrode.

6. A thin film transistor as set forth in claim 1, further comprising a first transparent pixel electrode which is formed at one side of the first drain electrode and in contact therewith and a second transparent pixel electrode formed at one side of the second drain electrode and in contact therewith.

7. A thin film transistor as set forth in claim 1, further comprising a transparent pixel electrode which is formed at one side of the first source and first drain electrodes.

8. A thin film transistor comprising:
   an insulation substrate
   a first source electrode and a first drain electrode formed on the insulation substrate, a first active layer formed so that it is in contact with the first source electrode and the first drain electrode;
   a common gate electrode formed on a first insulation layer which is on the first source electrode, the first drain electrode and the first active layer;
   a second active layer formed on a second insulation layer which is on the common gate electrode,
   a second source electrode and a second drain electrode formed on the second active layer,
   the first source electrodes are contacted and the first drain electrodes are in contact with the second source and second drain electrodes respectively through an opening formed in the insulation layers which are formed on the upper portion and the lower portion of the common gate electrode.

9. A thin film transistor comprising:
   an insulation substrate
   a first source electrode and a first drain electrode formed on the insulation substrate, a first active layer formed so that it is in contact with the first source electrode and the first drain electrode;
   a common gate electrode formed on a first insulation layer which is on the first source electrode, the first drain electrode and the first active layer;
   a second active layer formed on a second insulation layer which is on the common gate electrode,
   a second source electrode and a second drain electrode formed on the second active layer,
   the second source and drain electrodes are directly in contact respectively with a selected portion of the first source and first drain electrodes.

10. A thin film transistor as set forth in claim 1, wherein the first source/drain electrodes has a same width as or different from that of the second source/drain electrodes.

11. A thin film transistor as set forth in claim 1, wherein the first and second means for connecting includes wires located in an opening in the first and second insulation layers.

12. A thin film transistor as set forth in claim 1, wherein the first source electrode and the second source electrode have 7idths which are different from each other and the first drain electrode and the second drain electrode have widths which are different from each other.

13. A thin film transistor as set forth in claim 6, wherein the first and second transparent pixel electrodes are insulated from each other, so that they are in capacitive relationship.

* * * * *